(12) United States Patent
Sun

(10) Patent No.: US 11,259,105 B2
(45) Date of Patent: Feb. 22, 2022

(54) MEMS MICROPHONE AND METHOD OF MANUFACTURING THE SAME

(71) Applicant: DB HITEK CO., LTD., Seoul (KR)

(72) Inventor: Jong Won Sun, Icheon-si (KR)

(73) Assignee: DB HITEK CO., LTD., Seoul (KR)

( * ) Notice: Subject to any disclaimer, the term of this patent is extended or adjusted under 35 U.S.C. 154(b) by 0 days.

(21) Appl. No.: 16/506,604

(22) Filed: Jul. 9, 2019

(65) Prior Publication Data
US 2020/0014994 A1    Jan. 9, 2020

(30) Foreign Application Priority Data
Jul. 9, 2018  (KR) .................. 10-2018-0079598

(51) Int. Cl.
*H04R 1/08*        (2006.01)
*B81B 3/00*        (2006.01)
*B81C 1/00*        (2006.01)

(52) U.S. Cl.
CPC ............. *H04R 1/08* (2013.01); *B81B 3/0027* (2013.01); *B81C 1/00039* (2013.01); *B81C 1/00047* (2013.01); *B81C 1/00087* (2013.01); *B81C 1/00158* (2013.01); *B81B 2201/0257* (2013.01); *B81B 2203/0127* (2013.01); *B81B 2203/0307* (2013.01); *B81B 2203/0315* (2013.01); *B81B 2203/0353* (2013.01); *B81C 2201/0109* (2013.01)

(58) Field of Classification Search
CPC .... B81B 2203/0127; B81B 2203/0307; H04R 2307/207
See application file for complete search history.

(56) References Cited

U.S. PATENT DOCUMENTS

| | | | |
|---|---|---|---|
| 2010/0158279 A1* | 6/2010 | Conti | H04R 7/24 381/174 |
| 2015/0375991 A1* | 12/2015 | Schelling | B81B 3/0072 257/416 |
| 2017/0311083 A1 | 10/2017 | Sun et al. | |
| 2017/0311088 A1 | 10/2017 | Sun et al. | |
| 2017/0311089 A1 | 10/2017 | Sun et al. | |
| 2017/0359648 A1 | 12/2017 | Park et al. | |
| 2019/0047849 A1 | 2/2019 | Park et al. | |
| 2019/0052976 A1 | 2/2019 | Sun | |
| 2019/0082269 A1 | 3/2019 | Sun | |
| 2019/0082270 A1 | 3/2019 | Sun | |
| 2019/0082271 A1 | 3/2019 | Kim et al. | |

* cited by examiner

*Primary Examiner* — Raj R Gupta
(74) *Attorney, Agent, or Firm* — Patterson Thuente Pedersen, P.A.

(57) ABSTRACT

A MEMS microphone includes a substrate defining a cavity, a diaphragm being spaced apart from the substrate, covering the cavity, and being configured to generate a displacement thereof in response to an applied acoustic pressure, an anchor extending from an end portion of the diaphragm, the anchor including a lower surface in contact with an upper surface of the substrate to support the diaphragm, a back plate disposed over the diaphragm, the back plate being spaced apart from the diaphragm such that an air gap is maintained between the back plate and the diaphragm, and defining a plurality of acoustic holes and an upper insulation layer provided on the substrate, covering the back plate, and holding the back plate to space the back plate from the diaphragm, the upper insulation layer having a flat plate shape to prevent sagging of the back plate.

13 Claims, 10 Drawing Sheets

MEMS MICROPHONE AND METHOD OF MANUFACTURING THE SAME

CROSS-REFERENCE TO RELATED APPLICATION

This application claims priority to Korean Patent Application No. 10-2018-0079598, filed on Jul. 9, 2018 and all the benefits accruing therefrom under 35 U.S.C. § 119, the contents of which are incorporated by reference in their entirety.

TECHNICAL FIELD

The present disclosure relates to Micro-Electro-Mechanical Systems (MEMS) microphones capable of converting an acoustic wave into an electrical signal, and a method of manufacturing such MEMS microphones, and more particularly, to capacitive MEMS microphones that are capable of transmitting signals related to an acoustic signal using a displacement which may be generated due to an acoustic pressure and a method of manufacturing such MEMS microphones.

BACKGROUND

Generally, a capacitive microphone utilizes a capacitance between a pair of electrodes which are facing each other to generate an acoustic signal. A MEMS microphone may be manufactured by a semiconductor MEMS process to have an ultra-small size.

A MEMS microphone may include a substrate including a cavity, a bendable diaphragm and a back plate which is facing the diaphragm. The diaphragm is spaced apart from the substrate and the back plate so that the diaphragm can be freely bent upwardly and downwardly. The diaphragm can be a membrane structure to generate a displacement due to an acoustic pressure. In particular, when the acoustic pressure reaches to the diaphragm, the diaphragm may be bent upwardly or downwardly due to the acoustic pressure. The displacement of the diaphragm can be sensed through a change of capacitance between the diaphragm and the back plate. As a result, an acoustic wave can be converted into an electrical signal for output.

The MEMS microphone further includes an upper insulation layer for holding the back plate and separating the back plate from the diaphragm. The upper insulation layer has a chamber for forming an air gap between the diaphragm and the back plate.

A bias voltage is one of the factors that determine sensitivity of the MEMS microphone. The sensitivity of the MEMS microphone can be increased by increasing the bias voltage. In order to increase the bias voltage, the air gap between the diaphragm and the back plate must be increased.

However, it is difficult to increase the air gap due to a sagging of the back plate. In particular, since stress is concentrated on a bent portion in the chamber, the back plate is further sagged downward. Therefore, the sensitivity of the MEMS microphone may be reduced.

SUMMARY

The embodiments herein provide a MEMS microphone capable of preventing a back plate from being sagged downward, and a method of manufacturing the MEMS microphone.

According to an example embodiment herein, a MEMS microphone includes a substrate defining a cavity, a diaphragm being spaced apart from the substrate, covering the cavity, and being configured to generate a displacement thereof in response to an applied acoustic pressure, an anchor extending from an end portion of the diaphragm, the anchor including a lower surface in contact with an upper surface of the substrate to support the diaphragm, a back plate disposed over the diaphragm, the back plate being spaced apart from the diaphragm such that an air gap is maintained between the back plate and the diaphragm, and defining a plurality of acoustic holes and an upper insulation layer provided on the substrate, covering the back plate, and holding the back plate to space the back plate from the diaphragm, the upper insulation layer having a flat plate shape to prevent a sagging of the back plate.

In an example embodiment, the MEMS microphone may further include a lower insulation layer pattern interposed between the substrate and the upper insulation layer and positioned outside the diaphragm to expose the diaphragm and an sacrificial layer pattern interposed between the upper insulation layer and the lower insulation layer pattern and positioned outside the diaphragm to support the upper insulation layer such that the back plate is spaced apart from the diaphragm.

In an example embodiment, the lower insulation layer pattern and the sacrificial layer pattern may be positioned outside the anchor.

In an example embodiment, the MEMS microphone may further include a diaphragm pad disposed on an upper surface of the lower insulation layer pattern and electrically connected to the diaphragm, a back plate pad disposed on an upper surface of the sacrificial layer pattern and electrically connected to the back plate, a first pad electrode disposed on the upper insulation layer and located over the diaphragm pad to make contact with the diaphragm pad, and a second pad electrode on the upper insulation layer and located over the back plate pad to make contact with the back plate pad.

In an example embodiment, the upper insulation layer may include a covering portion covering the back plate and a flat portion extending from the covering portion to an upper surface of the sacrificial layer pattern.

In an example embodiment, the flat portion may be disposed over the anchor.

In an example embodiment, the anchor may have a ring shape surrounding the diaphragm.

In an example embodiment, the diaphragm may define a plurality of vent holes penetrating there through and communicating with the cavity.

In an example embodiment, the anchors may be spaced apart from each other along a periphery of the diaphragm, and slits may be formed between anchors adjacent to each other to provide a passage through which the acoustic pressure passes.

According to an example embodiment of the present invention, a MEMS microphone includes a substrate presenting a vibration area, a supporting area surrounding the vibration area and a peripheral area surrounding the supporting area, the substrate defining a cylindrical cavity formed in the vibration area, a diaphragm disposed in the vibration area, being spaced apart from the substrate, covering the cavity, and configured to generate a displacement thereof in response to an applied acoustic pressure, an anchor extending from an end portion of the diaphragm in the supporting area, the anchor including a lower surface in contact with an upper surface of the substrate to support the diaphragm, a back plate disposed over the diaphragm, the back plate being spaced apart from the diaphragm such that an air gap is maintained between the back plate and the diaphragm, and defining a plurality of acoustic holes and an upper insulation layer provided on the substrate, covering the back plate, and holding the back plate to space the back plate from the diaphragm, the upper insulation layer having a flat plate shape to prevent a sagging of the back plate.

In an example embodiment, the MEMS microphone may further include a lower insulation layer pattern interposed between the substrate and the upper insulation layer and positioned in the peripheral area to expose the diaphragm and an sacrificial layer pattern interposed between the upper insulation layer in the peripheral area and the lower insulation layer pattern and positioned outside the diaphragm to support the upper insulation layer such that the back plate is spaced apart from the diaphragm.

In an example embodiment, the upper insulation layer may include a covering portion covering the back plate and a flat portion extending from the covering portion to an upper surface of the sacrificial layer pattern.

In an example embodiment, the flat portion may be disposed over the anchor.

In an example embodiment, the flat portion may be positioned in the supporting area and the peripheral area.

In an example embodiment, the MEMS microphone may further include a diaphragm pad disposed on an upper surface of the lower insulation layer pattern and connected to the diaphragm, a back plate pad disposed on an upper surface of the sacrificial layer pattern and connected to the back plate, a first pad electrode disposed on the upper insulation layer and located over the diaphragm pad to make contact with the diaphragm pad and a second pad electrode on the upper insulation layer and located over the back plate pad to make contact with the back plate pad.

According to an example embodiment of the present invention, a method of manufacturing a MEMS microphone comprises the following: A lower insulation layer is formed on a substrate having a vibration area, a supporting area surrounding the vibration area, and a peripheral area surrounding the supporting area. A diaphragm and an anchor for supporting the diaphragm are formed on the lower insulation layer. A sacrificial layer is formed on the lower insulation layer to cover the diaphragm and the anchor. A back plate is formed on the sacrificial layer in the vibration area to face the diaphragm. An upper insulation layer is formed on the sacrificial layer to cover the back plate and hold the back plate to space the back plate from the diaphragm, and the upper insulation layer has a flat plate shape to prevent a sagging of the back plate. The upper insulation layer and the back plate are patterned to form a plurality of acoustic holes penetrating through the upper insulation layer and the back plate. The substrate is patterned to form a cavity in the vibration area to partially expose the lower insulation layer. Further, an etching process is performed whereby an etchant is passed through the cavity and the acoustic holes to remove portions of the sacrificial layer and the lower insulation layer, and each of the removed portions is located at positions corresponding the vibration area and the supporting area.

In an example embodiment, the upper insulation layer and the sacrificial layer may be positioned in the peripheral area, and the anchor may be positioned in the supporting area.

In an example embodiment, the anchor may present a ring shape configured to surround the vibration area, wherein forming the diaphragm and the anchor may include forming a plurality of vent holes penetrating through the diaphragm simultaneously with the diaphragm and the anchor, and wherein the vent holes may provide passages for the etchant during the etching process.

In an example embodiment, a plurality of the anchors may be spaced apart from each other along a periphery of the diaphragm, wherein forming the diaphragm and the anchor may include forming slits between anchors adjacent to each other simultaneously with the diaphragm and the anchor, and wherein the slits may provide passages for the etchant during the etching process.

According to example embodiments of the present invention as described above, the MEMS microphone includes the upper insulation layer having a flat plate shape without a strut. Since the upper insulation layer stably holds the back plate, a sagging of the back plate may be prevented. Thus, the air gap is maintained between the back plate and the diaphragm. Also, it is possible to prevent the sensitivity of the MEMS microphone from decreasing due to a dropping a bias voltage in the MEMS microphone.

Since the strut is not provided in the MEMS microphone, widths of the lower insulation layer pattern and the sacrificial layer pattern can be increased. Thus, the lower insulation layer pattern and the sacrificial layer pattern stably support the upper insulation layer and the sagging of the back plate can be effectively prevented.

In addition, since a mask pattern for forming the strut and the strut forming process can be omitted in manufacturing the MEMS microphone, process steps can be simplified, a manufacturing cost can be reduced, and process time can be shortened.

The above summary is not intended to describe each illustrated embodiment or every implementation of the subject matter hereof. The figures and the detailed description that follow more particularly exemplify various embodiments.

BRIEF DESCRIPTION OF THE DRAWINGS

Example embodiments can be understood in more detail from the following description taken in conjunction with the accompanying drawings, in which.

DETAILED DESCRIPTION OF EMBODIMENTS

Hereinafter, specific embodiments will be described in more detail with reference to the accompanying drawings. The present invention may, however, be embodied in different forms and should not be construed as limited to the embodiments set forth herein.

As an explicit definition used in this application, when a layer, a film, a region or a plate is referred to as being 'on' another one, it can be directly on the other one, or one or more intervening layers, films, regions or plates may also be present. By contrast, it will also be understood that when a layer, a film, a region or a plate is referred to as being 'directly on' another one, it is directly on the other one, and one or more intervening layers, films, regions or plates do not exist. Also, although terms such as a first, a second, and a third are used to describe various components, compositions, regions, films, and layers in various embodiments of the present invention, such elements are not limited to these terms.

Furthermore, and solely for convenience of description, elements may be referred to as "above" or "below" one another. It will be understood that such description refers to the orientation shown in the Figure being described, and that in various uses and alternative embodiments these elements could be rotated or transposed in alternative arrangements and configurations.

In the following description, the technical terms are used only for explaining specific embodiments while not limiting the scope of the present invention. Unless otherwise defined herein, all the terms used herein, which include technical or scientific terms, may have the same meaning that is generally understood by those skilled in the art.

The depicted embodiments are described with reference to schematic diagrams of some embodiments of the present invention. Accordingly, changes in the shapes of the diagrams, for example, changes in manufacturing techniques and/or allowable errors, are sufficiently expected. The Figures are not necessarily drawn to scale. Accordingly, embodiments of the present invention are not described as being limited to specific shapes of areas described with diagrams and include deviations in the shapes and also the areas described with drawings are entirely schematic and their shapes do not represent accurate shapes and also do not limit the scope of the present invention.

Figure 1:
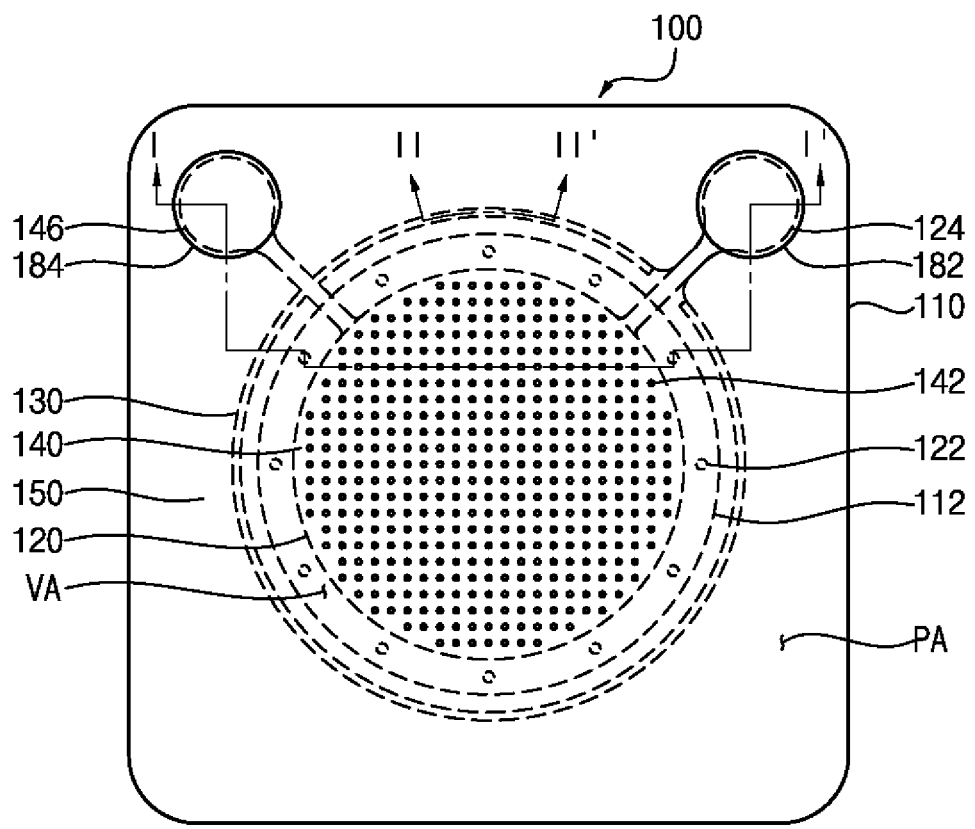
FIG. 1 is a plan view illustrating a MEMS microphone in accordance with an example embodiment of the present invention.
Figure 2:
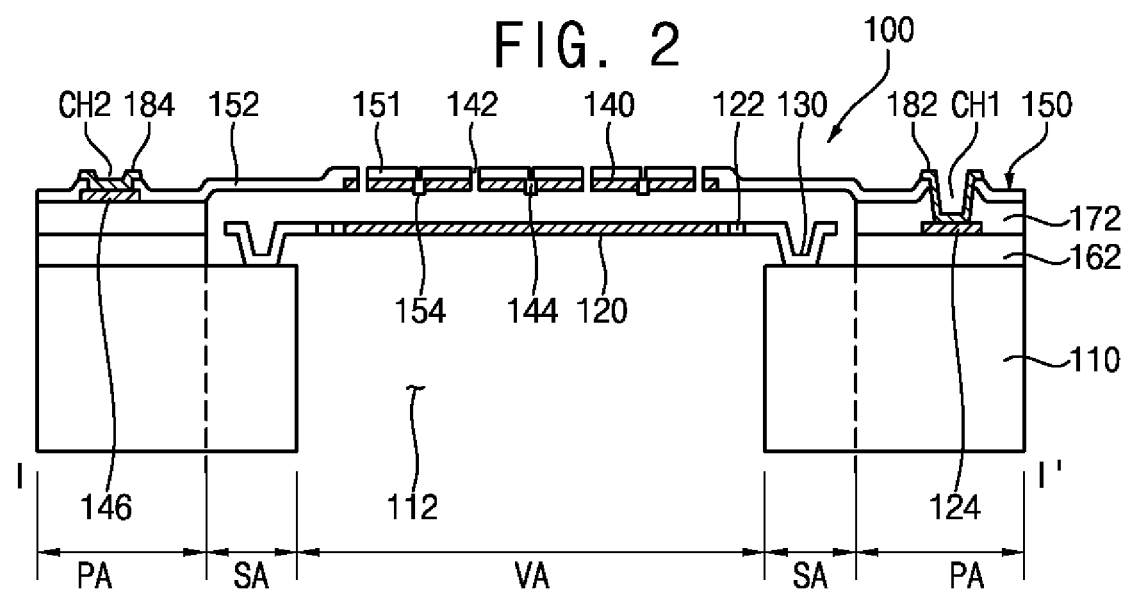
FIG. 2 is a cross sectional view taken along a line I-I' of FIG. 1.
Figure 3:
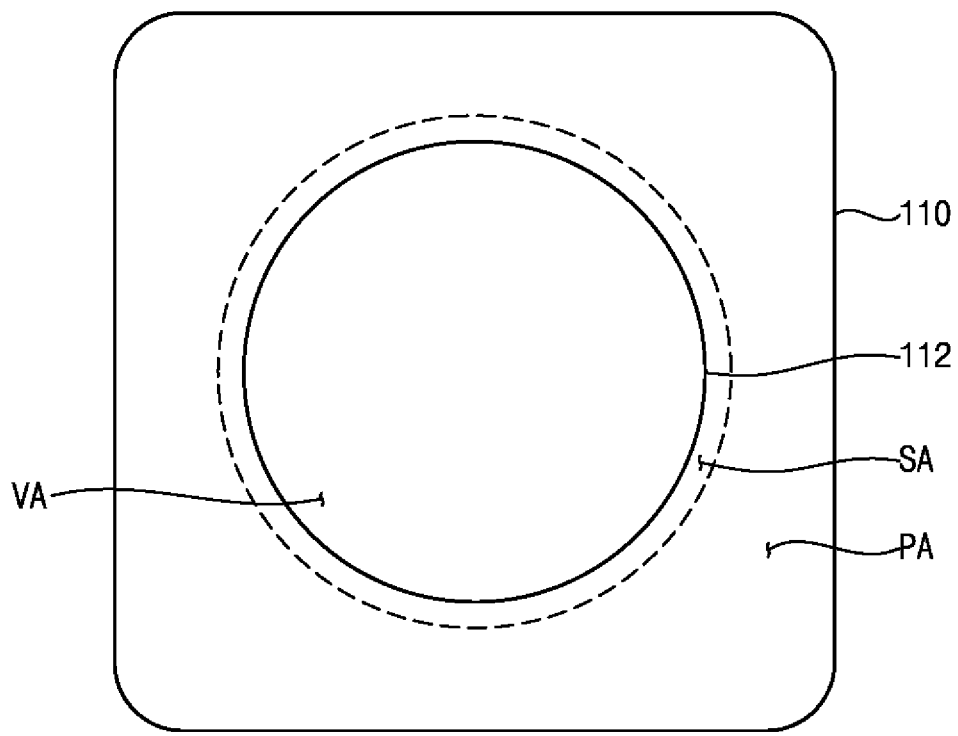
FIG. 3 is a plan view illustrating a substrate shown in FIG. 2.
Figure 4:
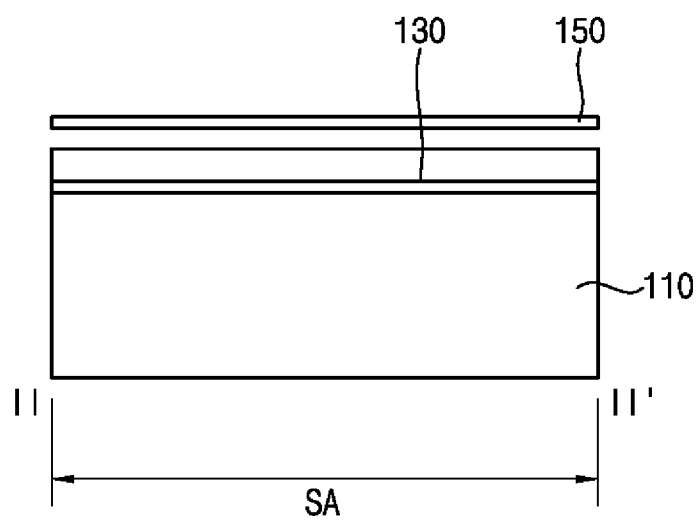
FIG. 4 is a cross sectional view taken along a line II-II' of FIG. 1.

FIG. 1 is a plan view illustrating a MEMS microphone in accordance with an example embodiment of the present invention, FIG. 2 is a cross sectional view taken along a line I-I' of FIG. 1, FIG. 3 is a plan view illustrating a substrate shown in FIG. 2, and FIG. 4 is a cross sectional view taken along a line II-II' of FIG. 1.

Referring to FIGS. 1 to 4, a MEMS microphone 100 in accordance with an example embodiment of the present invention is capable of creating a displacement in response to an applied acoustic pressure to convert an acoustic wave into an electrical signal and output the electrical signal. The MEMS microphone 100 includes a substrate 110, a diaphragm 120, an anchor 130 and a back plate 140.

As shown in FIG. 3, the substrate 110 may be divided into a vibration area VA, a supporting area SA surrounding the vibration area VA, and a peripheral area PA surrounding the supporting area SA. In the vibration area VA of the substrate 110, a cavity 112 is formed to provide a space into which the diaphragm 120 is bendable due to the acoustic pressure. The cavity 112 is defined by a cavity wall of the substrate 110.

In an example embodiment, the cavity 112 may have a cylindrical shape. Further, the cavity 112 may be formed in the vibration area VA to have a shape and a size corresponding to those of the vibration area VA.

The diaphragm 120 may be disposed over the substrate 110. The diaphragm may generate a displacement which may occur due to the acoustic pressure. The diaphragm 120 may have a membrane structure. The diaphragm 120 may cover the cavity 112. The diaphragm 120 may have a lower surface that is exposed through the cavity 112. The diaphragm 120 is bendable in response to the applied acoustic pressure, and the diaphragm 120 is spaced apart from the substrate 110.

As shown in FIG. 2, the diaphragm 120 may have a doped portion which is doped with impurities through an ion implantation process. The doped portion may be positioned to correspond to the back plate 140.

In an example embodiment, the diaphragm 120 may have a shape of a circular disc, as shown in FIG. 1.

Referring to FIGS. 1, 2 and 4, the anchor 130 is positioned at an end portion of the diaphragm 120. The anchor 130 is positioned in the supporting area SA of the substrate 110. The anchor 130 supports the diaphragm 120. As shown in FIG. 1, the anchor 130 may extend from a periphery of the diaphragm 120 toward the substrate 110 to space the diaphragm 120 from the substrate 110.

In an example embodiment of the present invention, the anchor 130 may be integrally formed with the diaphragm 120. The anchor 130 may have a lower surface that makes contact with an upper surface of the substrate 110.

In an example embodiment of the present invention, the anchor 130 may have a ring shape and may surround the cavity 112, as shown FIG. 1. The anchor 130 may have a vertical section of a U-shape, as shown FIG. 2.

Figure 5:
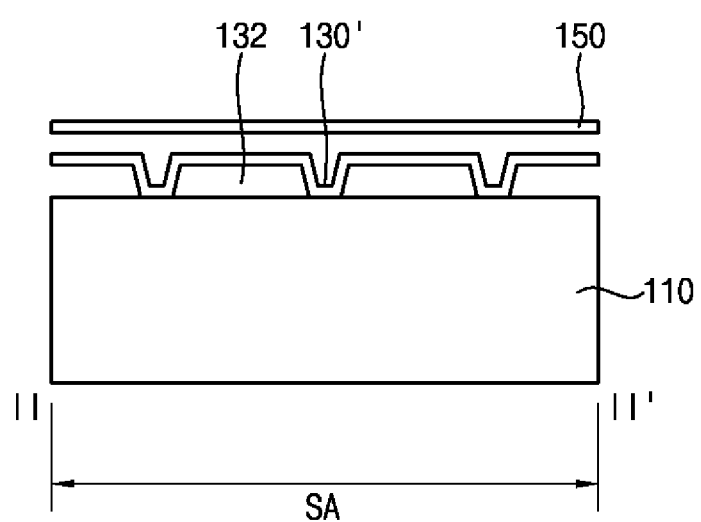
FIG. 5 is a cross sectional view taken along an equivalent to line II-II' illustrating another example of an anchor of FIG. 1.

FIG. 5 is a cross sectional view taken along a line similar to but in a different embodiment. That is, FIG. 5 still shows a cross-section passing through the substrate and the diaphragm of an alternative embodiment that has a different anchor than the one shown in FIG. 1.

Referring to FIG. 5, a plurality of the anchors 130' are arranged along a periphery of the diaphragm 120 to be spaced apart from each other.

Each of the anchors 130' may have a dot shape or an arc shape in a plan view. The each of the anchors 130' may have a columnar shape. The anchors 130' may have a vertical section of a U-shape, respectively. In particular, each of silts 132 may be formed between the anchors 130' adjacent to each other to provide a passage through which the acoustic pressure moves. Further, the each of the slits 132' may also function as a passage for the etchant to be used in the process of manufacturing the MEMS microphone 100.

The back plate 140 may be disposed over the diaphragm 120. The back plate 140 may be disposed in the vibration area VA to face the diaphragm 120. The back plate 140 may have a shape of a circular disc. The back plate 140 may have a doped portion which is formed by doping impurities through an ion implantation process.

As also shown in the other embodiment depicted in FIG. 2, the back plate 140 and the upper insulation layer 150 are spaced apart from the diaphragm 120 to make the diaphragm 120 freely bendable with responding to the acoustic pressure. Thus, an air gap AG is formed between the diaphragm 120 and the back plate 140. Here, the air gap AG is formed by removing a sacrificial layer between the diaphragm 120 and the back plate 140 to separate the diaphragm 120 and the back plate 140 from each other.

The diaphragm 120 may have a plurality of vent holes 122. As shown in FIG. 1, the vent holes 122 may be arranged along the anchor 130 in a ring shape and may be spaced apart from one another. The vent holes 122 are formed by penetrating through the diaphragm 120 in a vertical direction. The vent holes 122 communicate with the cavity 112. In particular, each of the vent holes 122 may serve as a passage for the applied acoustic wave. Further, each of the vent holes

122 may also function as a passage for the etchant to be used in the process of manufacturing the MEMS microphone 100.

The vent holes 122 are located about a circle having a diameter smaller than the inner diameter of the anchor 130 (i.e., positioned inside of the anchor 130 in a horizontal direction). The vent holes 122 may be positioned in the vibration area VA. Alternatively, the vent holes 122 may be positioned in a boundary region between the vibration region VA and the supporting region SA or in the supporting region SA adjacent to the vibration region VA.

In an example embodiment, the MEMS microphone 100 may further include an upper insulation layer 150, a lower insulation layer pattern 162 (see FIG. 7), a sacrificial layer pattern 172, a vibration pad 124, a back plate pad 146, a first pad electrode 182, and a second pad electrode 184.

In embodiments, the upper insulation layer 150 is positioned over the substrate 110 over which the back plate 140 is positioned. The upper insulation layer 150 may cover the back plate 140 to hold the back plate 140. Thus, the upper insulation layer 150 may space the back plate 140 from the diaphragm 120.

The upper insulation layer 150 may have a flat plate shape. In particular, the upper insulation layer 150 may include a covering portion 151 covering an upper surface of the back plate 140 and a flat portion 152 extending from the covering portion 151 to an upper surface of the sacrificial layer pattern 172. The flat portion 152 may be disposed over the anchor 130 and on the upper surface of the sacrificial layer pattern 172. In addition, the flat portion 152 may be positioned in the supporting area SA and the peripheral area PA. The covering portion 151 may be positioned in the vibration area VA.

The upper insulation layer does not include a strut configured to support the upper insulation layer and positioned in the supporting area SA. Since the upper insulation layer 150 does not include the strut, it is possible to prevent stress concentration on a specific portion of the upper insulation layer 150. Therefore, it is possible to prevent the upper insulation layer 150 from bending down due to the stress concentration. As a result, the back plate 140 held on the upper insulation layer 150 can be prevented from sagging.

Since a sagging of the back plate 140 may be prevented, the air gap between the back plate and the diaphragm is maintained. Also, it is possible to prevent the sensitivity of the MEMS microphone from decreasing due to a dropping a bias voltage in the MEMS microphone.

Since the strut is not provided in the MEMS microphone, widths of the lower insulation layer pattern and the sacrificial layer pattern can be increased. Thus, the lower insulation layer pattern and the sacrificial layer pattern stably support the upper insulation layer and the sagging of the back plate can be effectively prevented.

A plurality of acoustic holes 142 may be formed through the back plate 140 such that the acoustic wave may flow or pass through the acoustic holes 142. The acoustic holes 142 may be formed through the upper insulation layer 150 and the back plate 140 to communicate with the air gap AG.

The back plate 140 may include a plurality of dimple holes 144. Further, a plurality of dimples 154 may be positioned in the dimple holes 144. The dimple holes 144 may be formed through the back plate 140. The dimples 154 may be positioned to correspond to positions at which the dimple holes 144 are formed.

The dimples 154 may prevent the diaphragm 120 from being coupled to a lower face of the back plate 140, inhibiting a known issue of conventional MEMS microphones. When acoustic pressure is applied to the diaphragm 120, the diaphragm 120 can be bent in a generally semi-spherical or paraboloid shape toward the back plate 140, and then can return to its initial position. The degree of bending of the diaphragm 120 may vary depending on a magnitude of the applied acoustic pressure and may be increased to such an extent that an upper surface of the diaphragm 120 makes contact with the lower surface of the back plate 140. If the diaphragm 120 is bent so much as to contact the back plate 140, the diaphragm 120 may attach to the back plate 140 and may not return to the initial position. According to example embodiments, the dimples 154 may protrude from the lower surface of the back plate 140 toward the diaphragm 120. Even when the diaphragm 120 is so deformed that the diaphragm 120 contacts the back plate 140, the dimples 154 may keep the diaphragm 120 and the back plate 140 sufficiently separated from each other that the diaphragm 120 is able to return to the initial position.

The lower insulation layer pattern 162 may be disposed on the upper surface of the substrate 110 and under the upper insulation layer 150. In particular, the lower insulation layer pattern 162 may be disposed under the flat portion 152. The lower insulation layer pattern 162 may be located in the peripheral region PA, and be disposed outside of the outer perimeter of the anchor 130.

The diaphragm pad 124 may be formed on an upper surface of the lower insulation layer pattern 162. The diaphragm pad 124 may be located in the peripheral region PA. The diaphragm pad 124 may be electrically connected to the diaphragm 120 and may be doped with impurities. Though not shown in detail in figures, a connection portion may be doped with impurities to connect the doped portion of the diaphragm 120 to the diaphragm pad 124.

The sacrificial layer pattern 172 may be formed on the lower insulation layer pattern 162 on which the diaphragm pad 124 is formed, and under the upper insulation layer 150. As shown in FIG. 2, the lower insulation layer pattern 162 and the sacrificial layer pattern 172 are located in the peripheral region PA, and are disposed outside of the outer perimeter of the anchor 130. Further, the lower insulation layer pattern 162 and the sacrificial layer pattern 172 may be formed using a material different from that of the upper insulation layer 150.

Since the upper insulation layer 150 does not have the strut, widths of the lower insulation layer pattern 162 and the sacrificial layer pattern 172 can be increased as compared with prior arts. Therefore, the lower insulation layer pattern 162 and the sacrificial layer pattern 172 can firmly support the upper insulation layer 150. As a result, the sagging of the back plate 140 held by the upper insulation layer 150 can be effectively prevented.

The back plate pad 146 may be formed on an upper face of the sacrificial layer pattern 172. The back plate pad 146 may be located in the peripheral region PA. The back plate pad 146 may be electrically connected to the back plate 140 and may be doped with impurities by an ion implantation process. Though not shown in detail in figures, a connection portion may be doped with impurities to connect the back plate 140 to the back plate pad 146.

The first and second pad electrodes 182 and 184 may be disposed on the upper insulation layer 150 and in the peripheral area PA. The first pad electrode 182 is located over the diaphragm pad 124 to make contact with the diaphragm pad 124. The second pad electrode 184 is located over the back plate pad 146 to make contact with the back plate pad 146. As shown in FIG. 2, a first contact hole CH1 is formed by penetrating through the upper insulation layer 150 and the sacrificial layer pattern 172 to expose the diaphragm pad 124, and the first pad electrode 182 makes contact with the diaphragm pad 124 exposed by the first contact hole CH1. Further, a second contact hole CH2 is formed by penetrating through the upper insulation layer 150 to expose the back plate pad 146, and the second pad electrode 184 is formed in the second contact hole CH2 to make contact with the back plate pad 146 exposed by the second contact hole CH2.

As described above, the upper insulation layer 150 does not include a strut configured to support the upper insulation layer 150 and positioned in the supporting area SA. Since the upper insulation layer 150 does not include the strut, it is possible to prevent stress concentration on a specific portion of the upper insulation layer 150. Therefore, it is possible to prevent the upper insulation layer 150 from bending down due to the stress concentration. As a result, the back plate 140 held on the upper insulation layer 150 can be prevented from sagging.

Also, since the upper insulation layer 150 does not have the strut, widths of the lower insulation layer pattern 162 and the sacrificial layer pattern 172 can be increased as compared with prior arts. Therefore, the lower insulation layer pattern 162 and the sacrificial layer pattern 172 can firmly support the upper insulation layer 150. As a result, a sagging of the back plate 140 held by the upper insulation layer 150 can be effectively prevented.

Further, since the sagging of the back plate 140 may be prevented, the air gap between the back plate and the diaphragm is maintained. Also, it is possible to prevent the sensitivity of the MEMS microphone from decreasing due to a dropping a bias voltage in the MEMS microphone.

Hereinafter, a method of manufacturing a MEMS microphone will be described in detail with reference to the drawings.

Figure 6:
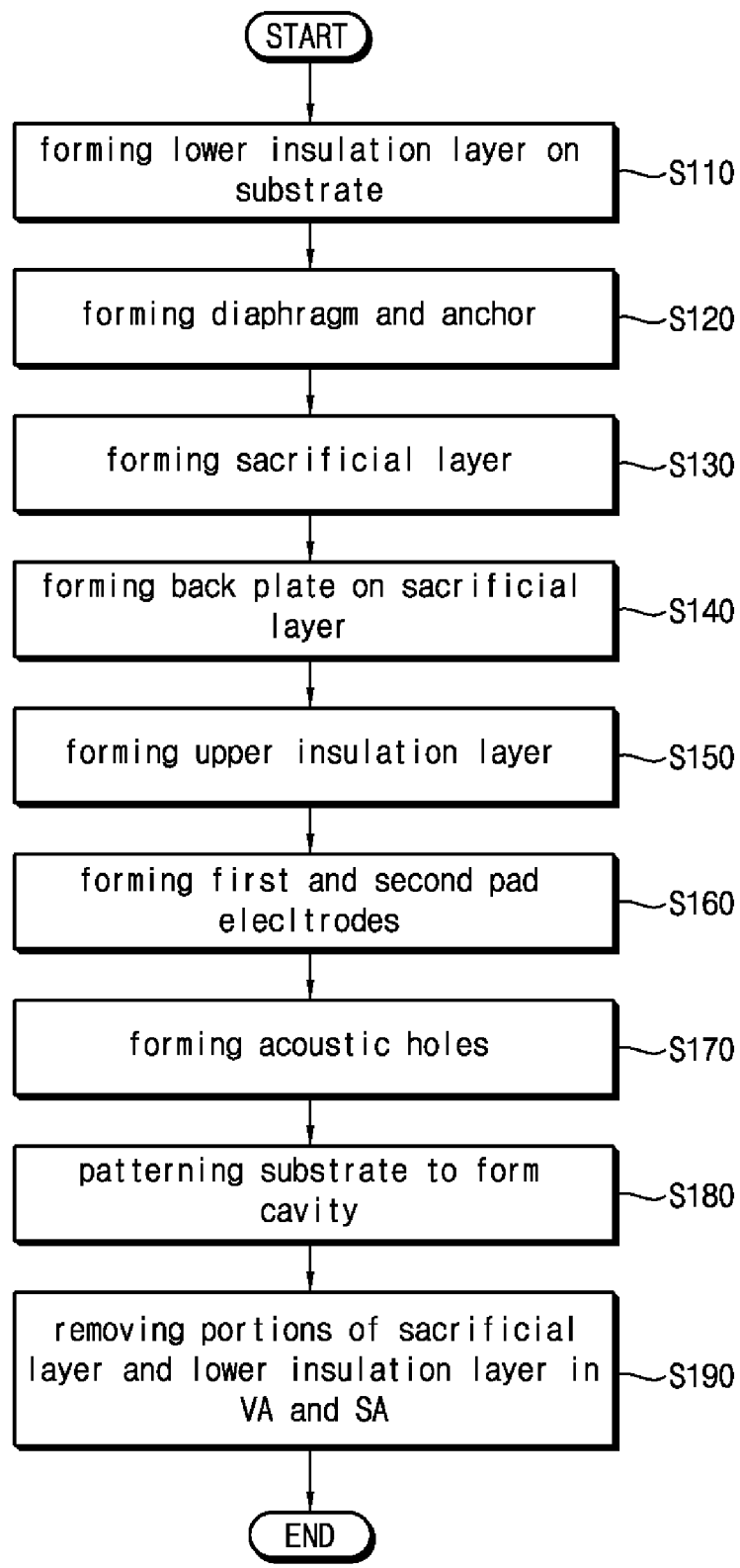
FIG. 6 is a flow chart illustrating a method of manufacturing a MEMS microphone in accordance with an example embodiment of the present invention.

FIG. 6 is a flow chart illustrating a method of manufacturing a MEMS microphone in accordance with an example embodiment of the present invention, and FIGS. 7 to 18 are cross sectional views illustrating a method of manufacturing a MEMS microphone in accordance with an example embodiment of the present invention.

Referring to FIGS. 6 to 9, according to example embodiments of a method for manufacturing a MEMS microphone, a lower insulation layer 160 is formed on a substrate 110 at S110.

Then, a diaphragm 120 and an anchor 130 are formed on the lower insulation layer 160 at S120.

Hereinafter, forming the diaphragm 120 (S120) and the anchor 130 (S130) will be in explained in further detail.

Figure 7:
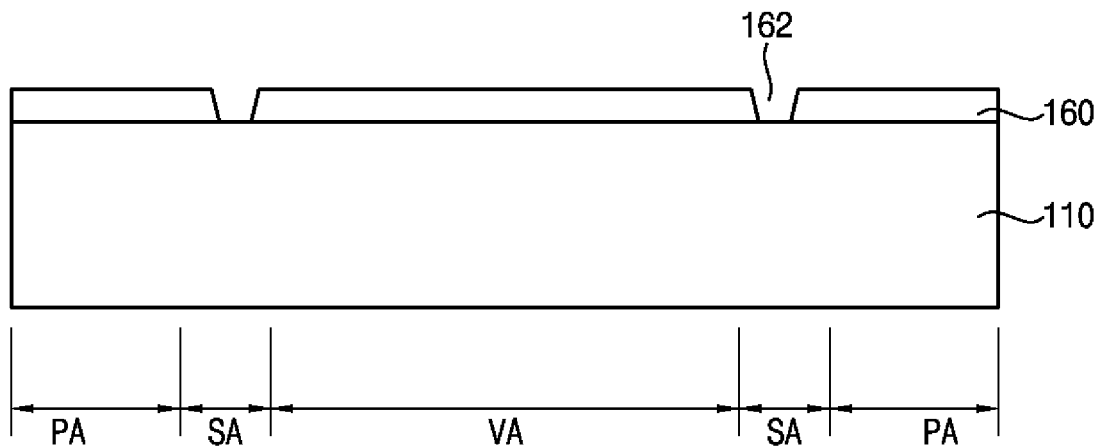
FIGS. 7 to 18 are cross sectional views illustrating a method of manufacturing a MEMS microphone in accordance with an example embodiment of the present invention.

The lower insulation layer 160 is patterned to form an anchor channel 162 for forming the anchor 130, as shown in FIG. 7. The anchor channel 162 may partially expose the substrate 110. The anchor channel 162 may be formed in the supporting area SA. For example, the anchor channel 162 may be formed to have a ring shape to surround the vibration area VA.

Figure 8:
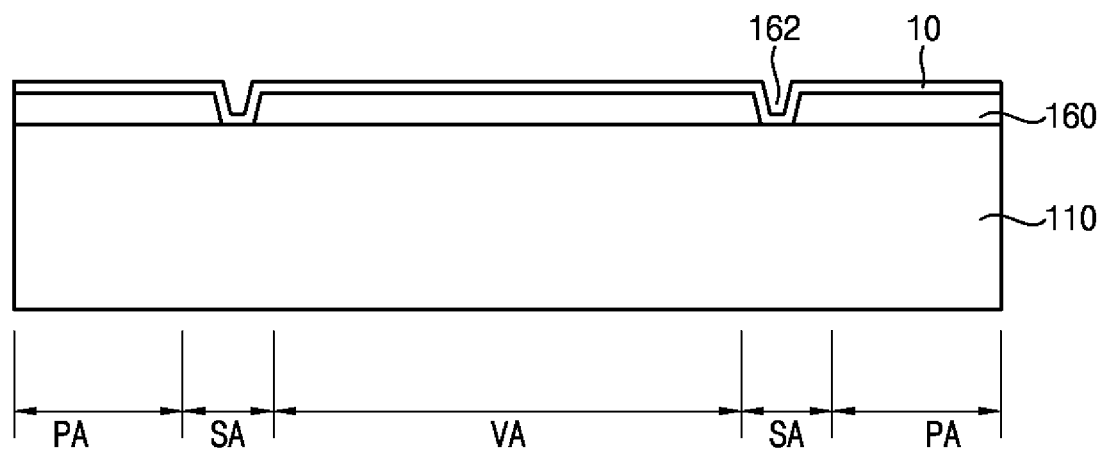

Next, as shown in FIG. 8, a first silicon layer 10 is formed on the lower insulation layer 160 to cover the anchor channel 162. The first silicon layer 10 may be formed using polysilicon, for example.

Impurities may be doped into both a portion of the first silicon layer 10 positioned in the vibration region VA and a portion of the first silicon layer 10 to be subsequently transformed into a diaphragm pad 124 through an ion implantation process.

Figure 9:
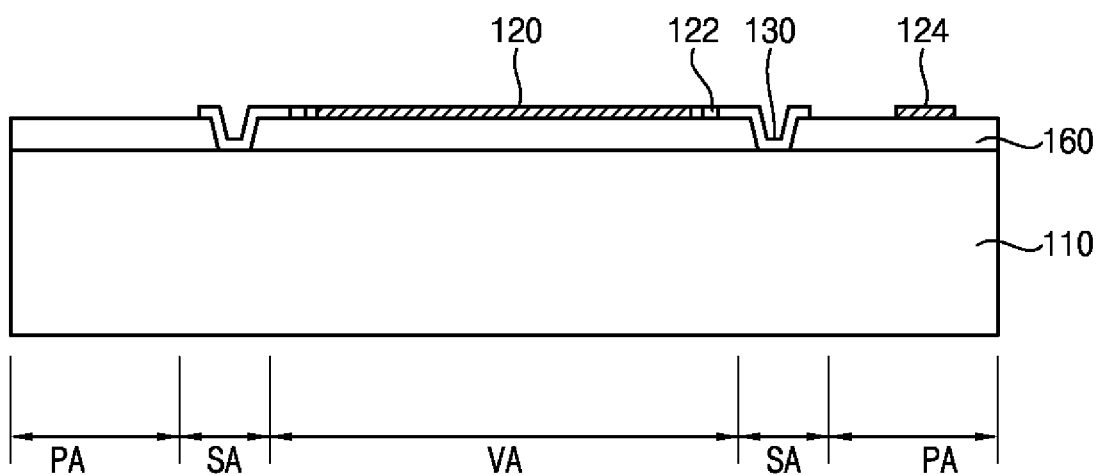

Then, the first silicon layer 10 is patterned to form a diaphragm 120 and the anchor 130, as shown in FIG. 9. Further, the diaphragm pad 124 is formed in the peripheral area PA and a plurality of vent holes 122 may be formed to penetrate through the diaphragm 120 as well. The vent holes 122 may be positioned in the vibration region VA.

In an example embodiment of the present invention, the anchor 130 may have a ring shape and may surround the diaphragm 120. (See FIG. 1)

In another example embodiment of the present invention, a plurality of the anchors 130 is arranged along a periphery of the diaphragm 120 to be spaced apart from each other. (See FIG. 5.) Each of the anchors 130 may have a dot shape or an arc shape in a plan view. In particular, each of silts 132 may be formed between the anchors 130 adjacent to each other to provide a passage through which the acoustic pressure moves. Further, the each of the slits 132 may also function as a passage for the etchant to be used in the process of manufacturing the MEMS microphone 100.

Figure 10:
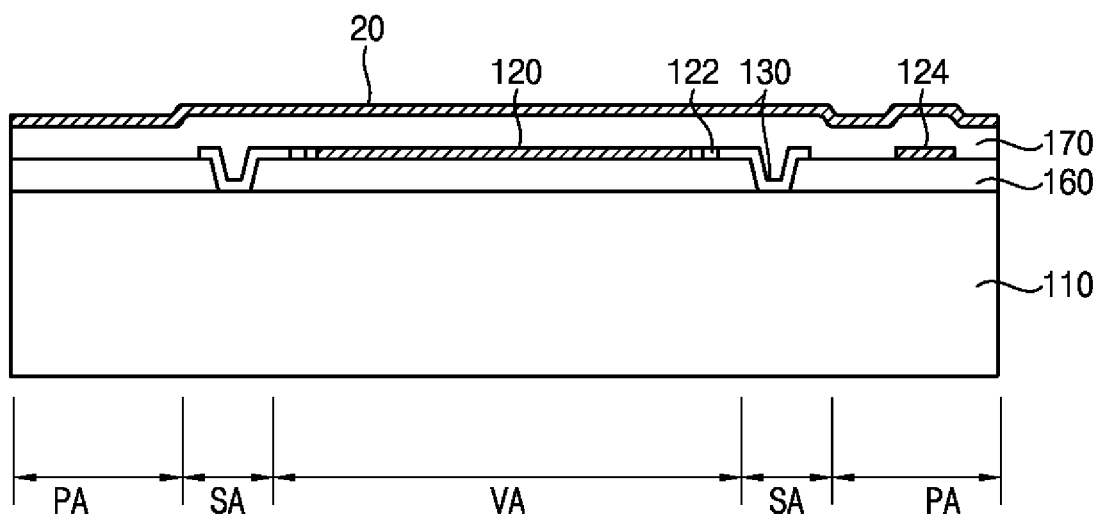

Referring to FIGS. 6 and 10, a sacrificial layer 170 is formed on the lower insulation layer 160 to cover the diaphragm 120 and the diaphragm pad 124 at S130.

Figure 11:
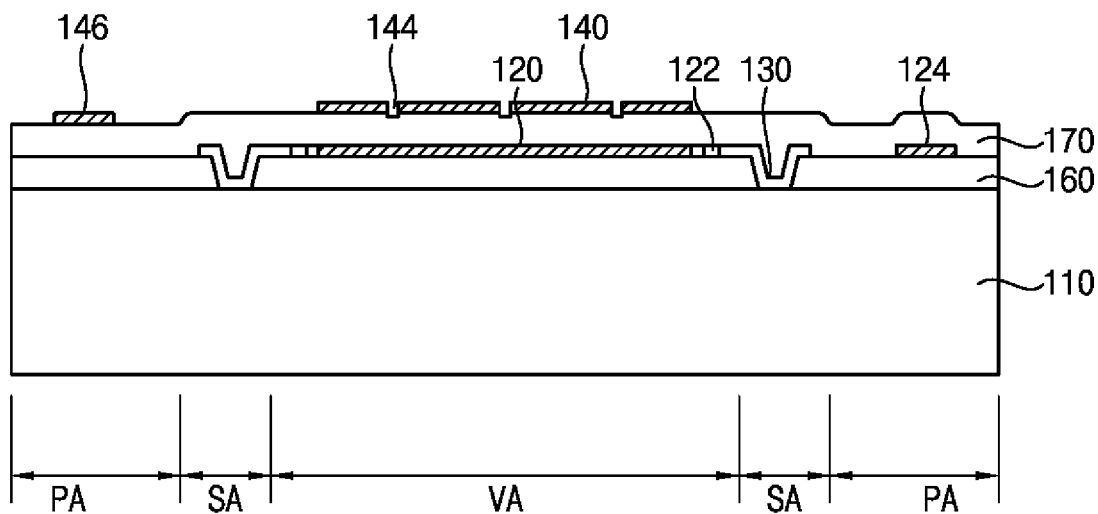

Referring to FIGS. 6 and 11, a back plate 140 is formed on the sacrificial layer 170 at S140.

Particularly, a second silicon layer 20 is formed on an upper surface of the sacrificial layer 170. Then, impurities are doped with the second silicon layer 20 by an ion implantation process. In an example embodiment, the second silicon layer 20 may be formed using polysilicon.

Next, as shown in FIG. 11, the second silicon layer 20 is patterned to form a back plate 140 and a back plate pad 146. Further, when forming the back plate 140 and the back plate pad 146, dimple holes 144 for forming dimples 154 (see FIG. 2) may be further formed, whereas acoustic holes 142 (see FIG. 2) may not be formed. A portion of the sacrificial layer 170 corresponding to the dimple holes 144 may be etched to cause the dimples 154 to protrude downwardly from a lower surface of the back plate 140.

Figure 12:
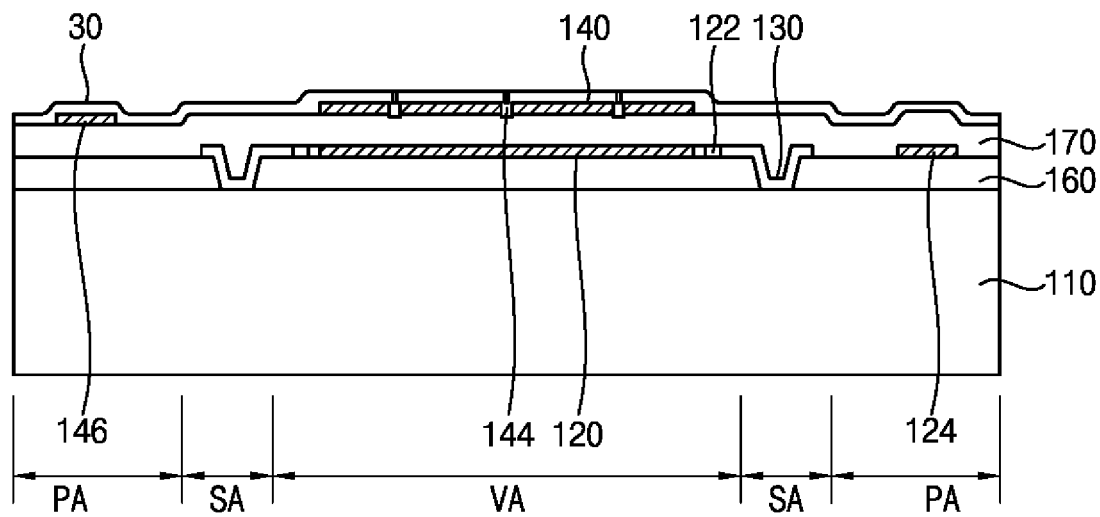
Figure 13:
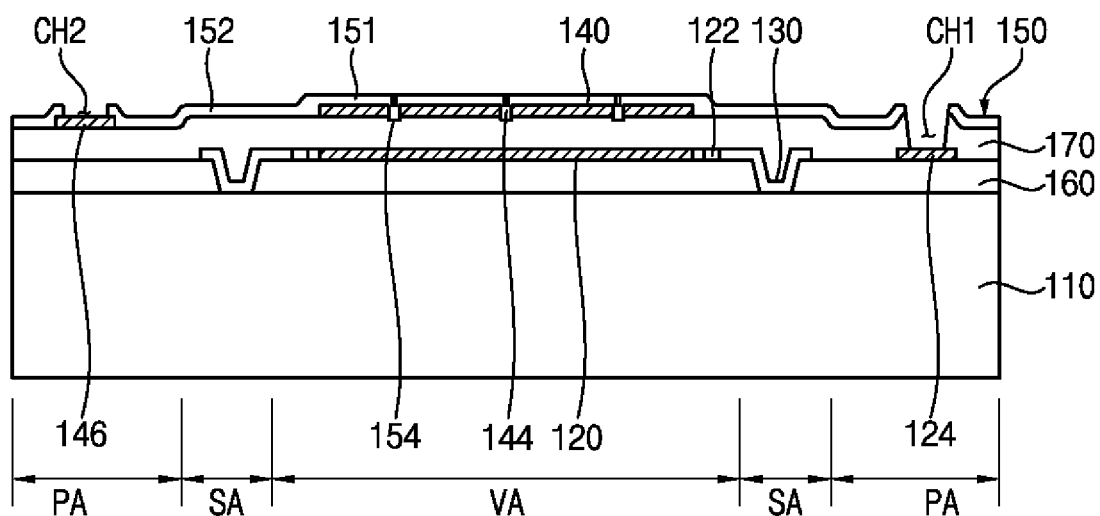

Referring to FIGS. 6, 12 and 13, an upper insulation layer 150 is formed on the sacrificial layer 170 on which the back plate 140 and the back plate pad 146 are formed at S150.

In particular, after an insulation layer 30 is formed on the sacrificial layer 170 to cover the back plate 140 and the back plate pad 146 (see FIG. 12), the insulation layer 30 is patterned to form the upper insulation layer 150 (see FIG. 13). The upper insulation layer 150 may include a covering portion 151 covering an upper surface of the back plate 140 and a flat portion 152 extending from the covering portion 151 to an upper surface of the sacrificial layer pattern 172. The flat portion 152 may be disposed over the anchor 130. In addition, the flat portion 152 may be positioned in the supporting area SA and the peripheral area PA. The covering portion 151 may be positioned in the vibration area VA.

Further, the dimples 154 may be further formed in the dimple holes 144 and a second contact hole CH2 is formed to expose the back plate pad 146. Furthermore, both a portion of the insulation layer 30 and a portion of the sacrificial layer 170, positioned over the diaphragm pad 124, are removed to form a first contact hole CH1.

In an example embodiment, the insulation layer 30 may be formed using a material different from those of the lower insulation layer 160 and the sacrificial layer 170. In one example embodiment, the insulation layer 30 is formed using silicon nitride or silicon oxynitride, whereas the lower insulation layer 160 and the sacrificial layer 170 are formed using silicon oxide.

Figure 14:
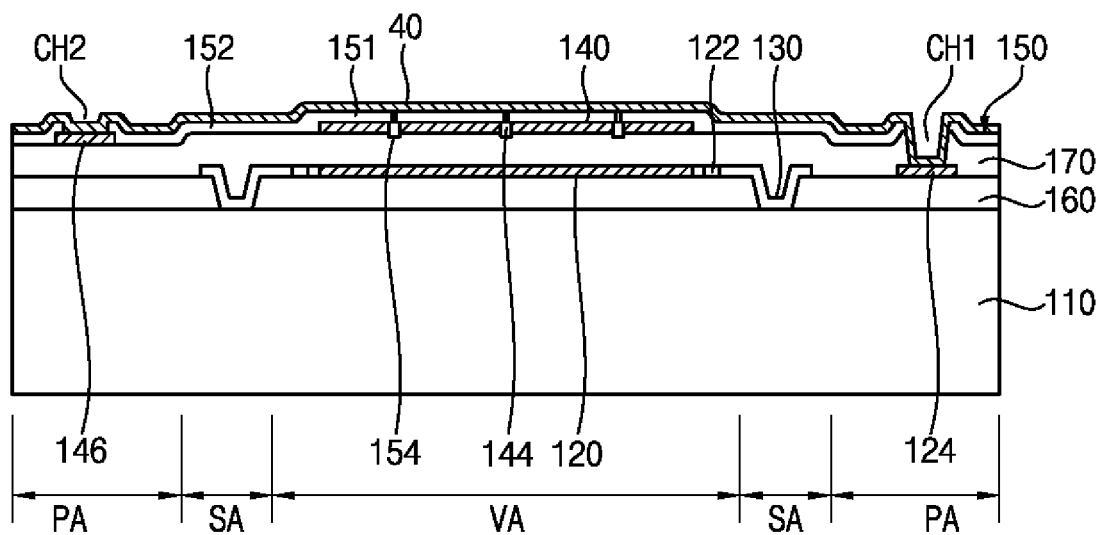
Figure 15:
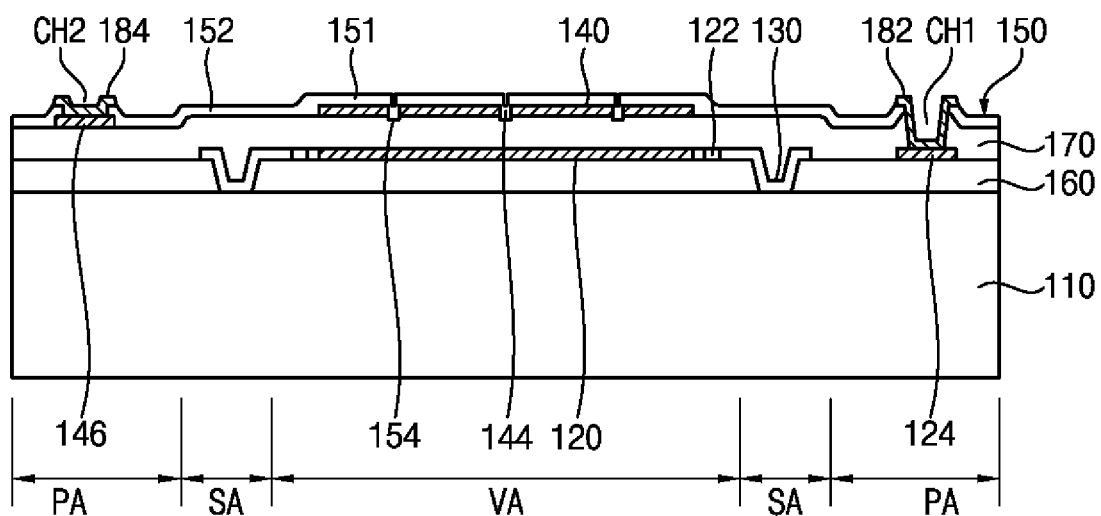

Referring to FIGS. 6, 14 and 15, after forming the first and the second contact holes CH1 and CH2, a first pad electrode 182 and a second pad electrode 184 may be formed in the peripheral region PA at S160.

In particular, a thin layer 40 is formed on the upper insulation layer 150 through which the first and the second contact holes CH1 and CH2 are formed, as shown in FIG. 14. In an example embodiment, the thin layer 40 may be formed using a conductive metal such as aluminum.

Next, the thin layer 40 is patterned to form a first pad electrode 182 and a second pad electrode 172, as shown in FIG. 15.

Figure 16:
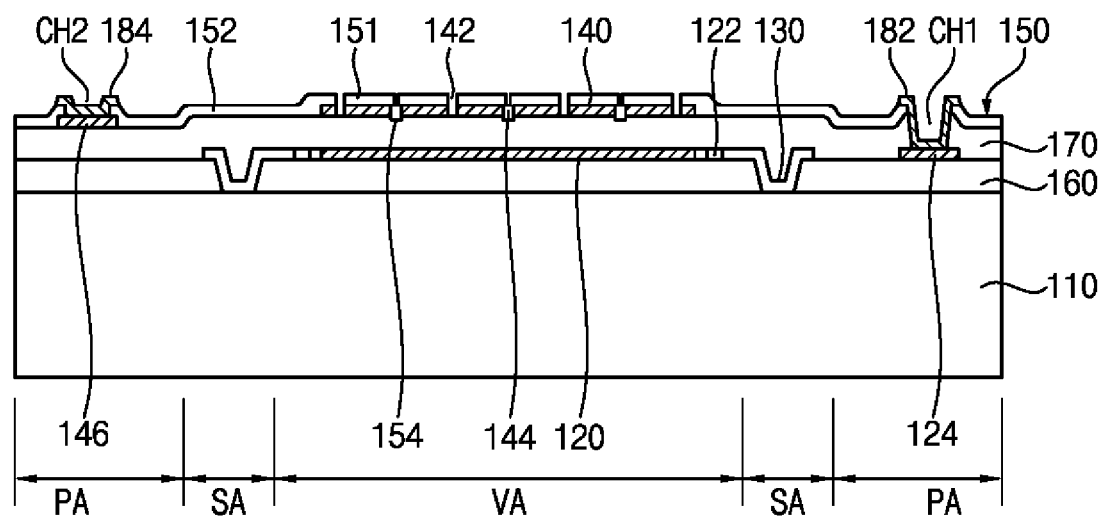

Referring to FIGS. 6 and 16, the upper insulation layer 150 and the back plate 140 are patterned to form acoustic holes 142 in the vibration area VA at S170.

Figure 17:
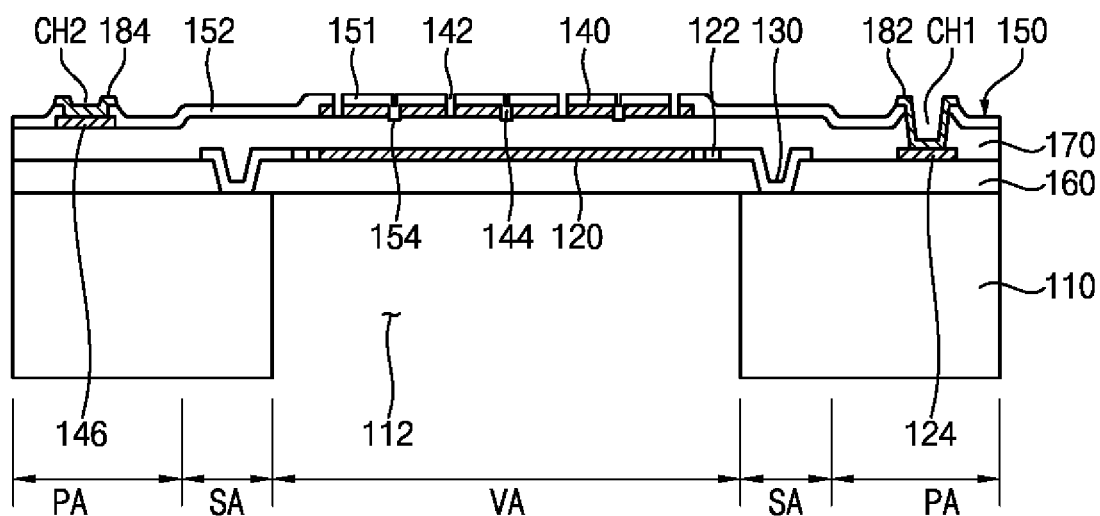
Figure 18:
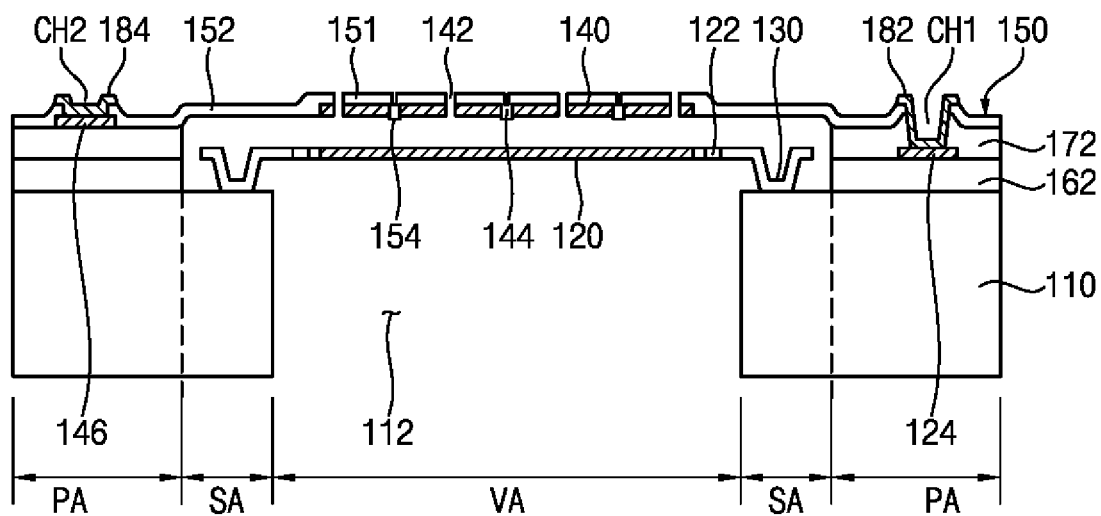

Referring to FIGS. 6, 17, and 18, after forming the acoustic holes 142, the substrate 110 is patterned to form a cavity 112 in the vibration area VA at S180. Thus, a portion of the lower insulation layer 160 is exposed through the cavity 112.

Next, portions of the sacrificial layer 170 and the lower insulation layer 160, corresponding to the vibration area VA and the supporting area SA are removed through an etching process using the cavity 112 and the acoustic holes 142 to form a sacrificial layer pattern 172 and a low insulation layer pattern 162 at step S190. As a result, the diaphragm 120 is exposed through the cavity 112, and an air gap AG is formed between the diaphragm 120 and the back plate 140. The cavity 112, the acoustic holes 142, and the vent holes 122 may also act as passages of etchant for partially removing the lower insulation layer 160 and the sacrificial layer 170.

In addition, the anchor 130 may function to restrict the flow of the etchant during the removal of the sacrificial layer 170 and the lower insulation layer 160 from the vibration region VA and the support region SA. Therefore, an etching amount of the sacrificial layer 170 and the lower insulation layer 160 may be adjusted to prevent the lower insulation layer 160 from remaining inside of the anchor 130.

In an example embodiment of the present invention, a hydrogen fluoride vapor (HF vapor) may be used as the etchant for removing the sacrificial layer 170 and the lower insulation layer 160.

As described above, according to the methods of manufacturing a MEMS microphone of the present invention, the back plate 140 and the diaphragm 120 can be spaced apart from each other by the sacrificial layer pattern 172 without forming a strut. Since, a mask pattern for forming the strut and a strut forming process can be omitted in manufacturing the MEMS microphone, process steps can be simplified, a manufacturing cost can be reduced, and process time can be shortened.

In addition, the strut forming process can be omitted in manufacturing the MEMS microphone, it is possible to prevent stress concentration on a specific portion of the upper insulation layer 150. Therefore, it is possible to prevent the upper insulation layer 150 from bending down due to the stress concentration. As a result, the back plate 140 held on the upper insulation layer 150 can be prevented from sagging.

Also, since the upper insulation layer 150 does not have the strut, widths of the lower insulation layer pattern 162 and the sacrificial layer pattern 172 can be increased as compared with prior arts. Therefore, the lower insulation layer pattern 162 and the sacrificial layer pattern 172 can firmly support the upper insulation layer 150. As a result, the sagging of the back plate 140 held by the upper insulation layer 150 can be effectively prevented.

Further, since a sagging of the back plate 140 may be prevented, the air gap AG between the back plate 140 and the diaphragm 120 is maintained. Also, it is possible to prevent sensitivity of the MEMS microphone from decreasing due to a dropping a bias voltage in the MEMS microphone Although the MEM microphone has been described with reference to the specific embodiments, they are not limited thereto. Therefore, it will be readily understood by those skilled in the art that various modifications and changes can be made thereto without departing from the spirit and scope of the appended claims.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112(f) of 35 U.S.C. are not to be invoked unless the specific terms "means for" or "step for" are recited in a claim.

What is claimed is:

1. A Micro-Electro-Mechanical Systems (MEMS) microphone comprising:
   a substrate defining a cavity;
   a diaphragm being spaced apart from the substrate, covering the cavity, and being configured to generate a displacement thereof in response to an applied acoustic pressure;

an anchor extending from an end portion of the diaphragm, the anchor including a lower surface in contact with an upper surface of the substrate to support the diaphragm;
a back plate disposed over the diaphragm, the back plate being spaced apart from the diaphragm such that an air gap is maintained between the back plate and the diaphragm, the back plate defining a plurality of acoustic holes;
an upper insulation layer provided on the substrate, covering the back plate, and holding the back plate to space the back plate from the diaphragm, the upper insulation layer having a flat plate shape to prevent a sagging of the back plate,
a lower insulation layer pattern interposed between the substrate and the upper insulation layer and positioned outside the diaphragm to expose the diaphragm; and
a sacrificial layer pattern interposed between the upper insulation layer and the lower insulation layer pattern and positioned outside the diaphragm to support the upper insulation layer such that the back plate is spaced apart from the diaphragm,
wherein the back plate has a shape of a circular disc, is spaced apart from the substrate, and is not directly supported by the substrate, and the lower insulating layer pattern and the sacrificial layer pattern are disposed to be adjacent to the anchor entirely without any intervening element.

2. The MEMS microphone of claim 1, wherein the lower insulation layer pattern and the sacrificial layer pattern are both positioned opposite the anchor from the cavity.

3. The MEMS microphone of claim 1, further comprising:
a diaphragm pad disposed on an upper surface of the lower insulation layer pattern and electrically connected to the diaphragm;
a back plate pad disposed on an upper surface of the sacrificial layer pattern and electrically connected to the back plate;
a first pad electrode disposed on the upper insulation layer and located over the diaphragm pad to make contact with the diaphragm pad; and
a second pad electrode on the upper insulation layer and located over the back plate pad to make contact with the back plate pad.

4. The MEMS microphone of claim 1, wherein the upper insulation layer includes a covering portion covering the back plate and a flat portion extending from the covering portion to an upper surface of the sacrificial layer pattern.

5. The MEMS microphone of claim 4, wherein the flat portion is disposed over the anchor.

6. The MEMS microphone of claim 1, wherein the anchor has a ring shape and surrounds the diaphragm.

7. The MEMS microphone of claim 6, wherein the diaphragm defines a plurality of vent holes penetrating therethrough and communicating with the cavity.

8. The MEMS microphone of claim 1, wherein the anchors are spaced apart from each other along a periphery of the diaphragm, and slits are formed between anchors adjacent to each other to provide a passage through which the acoustic pressure passes.

9. A MEMS microphone comprising:
a substrate defining a vibration area, the substrate having a supporting area surrounding the vibration area and a peripheral area surrounding the supporting area, the substrate defining a cavity corresponding to the vibration area;
a diaphragm disposed in the vibration area, being spaced apart from the substrate, covering the cavity, and configured to generate a displacement thereof in response to an applied acoustic pressure;
an anchor extending from an end portion of the diaphragm in the supporting area, the anchor including a lower surface in contact with an upper surface of the substrate to support the diaphragm;
a back plate disposed over the diaphragm, the back plate being spaced apart from the diaphragm such that an air gap is maintained between the back plate and the diaphragm, and defining a plurality of acoustic holes;
an upper insulation layer provided on the substrate, covering the back plate, and holding the back plate to space the back plate from the diaphragm, the upper insulation layer having a flat plate shape to prevent a sagging of the back plate;
a lower insulation layer pattern interposed between the substrate and the upper insulation layer and positioned outside the diaphragm to expose the diaphragm; and
a sacrificial layer pattern interposed between the upper insulation layer and the lower insulation layer pattern and positioned outside the diaphragm to support the upper insulation layer such that the back plate is spaced apart from the diaphragm,
wherein the back plate has a shape of a circular disc, is spaced apart from the substrate, and is not directly supported by the substrate, and the lower insulating layer pattern and the sacrificial layer pattern are disposed to be adjacent to the anchor entirely without any intervening element.

10. The MEMS microphone of claim 9, wherein the upper insulation layer includes a covering portion covering an upper surface of the back plate and a flat portion extending from the covering portion to an upper surface of the sacrificial layer pattern.

11. The MEMS microphone of claim 10, wherein the flat portion is disposed over the anchor and on the upper surface of the sacrificial layer pattern.

12. The MEMS microphone of claim 10, wherein the flat portion is positioned in the supporting area and the peripheral area.

13. The MEMS microphone of claim 9, further comprising:
a diaphragm pad disposed on an upper surface of the lower insulation layer pattern and connected to the diaphragm;
a back plate pad disposed on an upper surface of the sacrificial layer pattern and connected to the back plate;
a first pad electrode disposed on the upper insulation layer and located over the diaphragm pad to make contact with the diaphragm pad; and
a second pad electrode on the upper insulation layer and located over the back plate pad to make contact with the back plate pad.

* * * * *